United States Patent
Jiang et al.

(10) Patent No.: US 9,060,441 B2
(45) Date of Patent: Jun. 16, 2015

(54) ELECTRONIC DEVICE AND POWER SUPPLY POSITIOINING APPARATUS THEREOF

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Tie-Shan Jiang, Shenzhen (CN); Wen-Tang Peng, New Taipei (TW); Guang-Yi Zhang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 115 days.

(21) Appl. No.: 13/945,921

(22) Filed: Jul. 19, 2013

(65) Prior Publication Data

US 2014/0369011 A1 Dec. 18, 2014

(30) Foreign Application Priority Data

Jun. 14, 2013 (CN) .......................... 2013 1 02354114

(51) Int. Cl.
*H05K 5/00* (2006.01)
*H05K 7/14* (2006.01)
*G11B 33/12* (2006.01)
*H05K 7/20* (2006.01)
*G06F 1/18* (2006.01)

(52) U.S. Cl.
CPC ............ *H05K 7/1427* (2013.01); *G11B 33/128* (2013.01); *H05K 7/1432* (2013.01); *H05K 7/20581* (2013.01); *G06F 1/188* (2013.01); *G06F 1/187* (2013.01)

(58) Field of Classification Search
CPC . H05K 7/1427; H05K 7/1432; H05K 7/1439; H05K 7/1457; H05K 7/20581; G06F 1/187; G06F 1/188; G11B 33/128
USPC .......... 361/724–727, 679.55, 679.31, 679.33, 361/679.43, 755
See application file for complete search history.

(56) References Cited

U.S. PATENT DOCUMENTS

| | | | | |
|---|---|---|---|---|
| 5,584,396 | A * | 12/1996 | Schmitt | 211/26 |
| 5,838,533 | A * | 11/1998 | Yazaryan et al. | 361/600 |
| 6,025,989 | A * | 2/2000 | Ayd et al. | 361/695 |
| 6,538,879 | B2 * | 3/2003 | Jiang | 361/679.6 |
| 6,781,841 | B2 * | 8/2004 | Kim et al. | 361/724 |
| 6,816,367 | B2 * | 11/2004 | Liu et al. | 361/679.33 |
| 7,054,155 | B1 * | 5/2006 | Mease et al. | 361/695 |
| 7,542,300 | B1 * | 6/2009 | Lui et al. | 361/755 |
| 7,548,416 | B2 * | 6/2009 | Lin et al. | 361/679.33 |
| 2005/0018976 | A1 * | 1/2005 | Lee et al. | 385/88 |
| 2006/0256522 | A1 * | 11/2006 | Wei et al. | 361/695 |

(Continued)

*Primary Examiner* — Adrian S Wilson
*Assistant Examiner* — Abhishek Rathod
(74) *Attorney, Agent, or Firm* — Novak Druce Connolly Bove + Quigg LLP

(57) ABSTRACT

A power supply positioning apparatus includes a bracket and a circuit board mounted in the bracket. The bracket defines a receiving slot for receiving a power supply unit. A connector is mounted on the circuit board and aligns with the receiving slot. A first end of the bracket is rotatably connected to a chassis of an electronic device, and a second end of the bracket can be latched to the chassis. The bracket faces outside of the chassis.

10 Claims, 4 Drawing Sheets

(56) References Cited

U.S. PATENT DOCUMENTS

2008/0239649 A1* 10/2008 Bradicich et al. ............ 361/683
2010/0254112 A1* 10/2010 Brown et al. ................ 361/818
2011/0043986 A1* 2/2011 Conn et al. ............... 361/679.02
2011/0267761 A1* 11/2011 Peng et al. ............... 361/679.31
2011/0287650 A1* 11/2011 Kangas ......................... 439/310
2013/0342988 A1* 12/2013 Peng et al. ............... 361/679.33

* cited by examiner

ELECTRONIC DEVICE AND POWER SUPPLY POSITIOINING APPARATUS THEREOF

BACKGROUND

1. Technical Field

The present disclosure relates to electronic devices, and particularly to an electronic device with an apparatus for positioning a power supply.

2. Description of Related Art

Power supply units are generally mounted in a bracket of an electronic device. However, the power supply units typically occupy a large amount of space in the bracket.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one."

Figure 1:
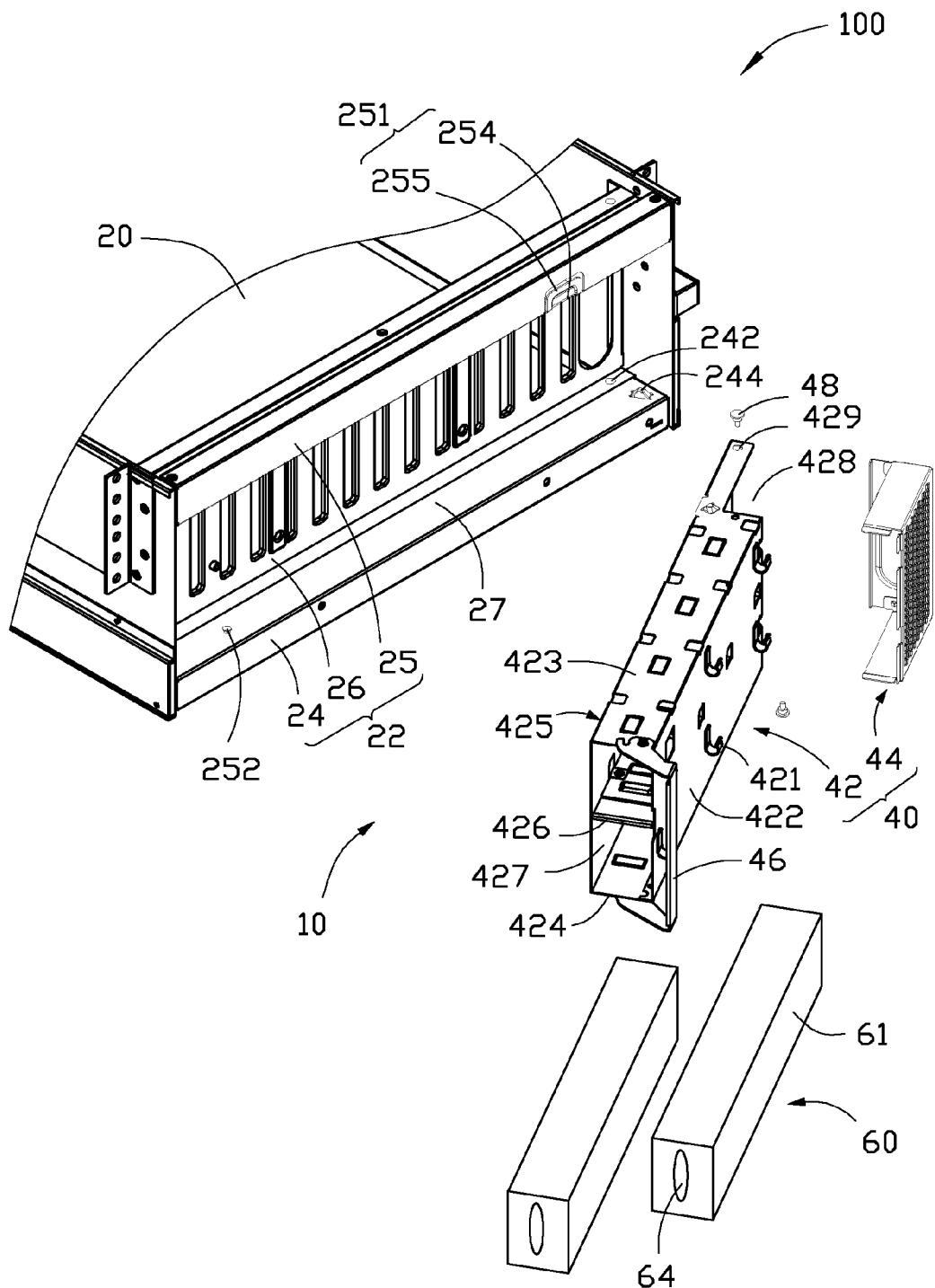
FIG. 1 is an exploded, isometric view of an embodiment of an electronic device.
Figure 2:
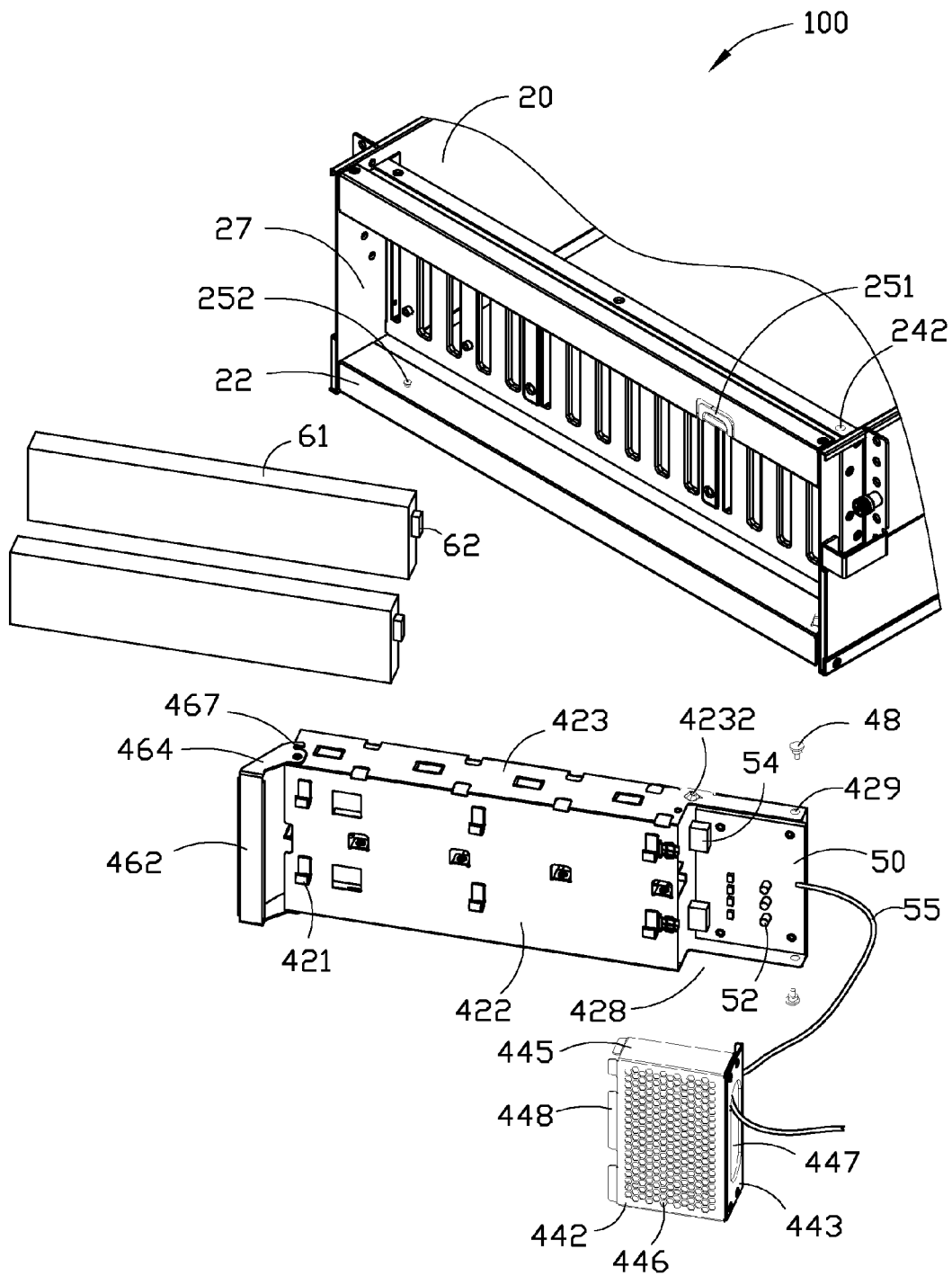
FIG. 2 is similar to FIG. 1, but viewed from another perspective.

FIGS. 1 and 2 show an embodiment of an electronic device 100. The electronic device 100 includes a chassis 20, a power supply positioning apparatus 10, and two power supply units 60. A plurality of components (not shown), such as a motherboard and a data storage apparatus, is installed in the chassis 20. The power supply positioning apparatus 10 includes a bracket 40 and a circuit board 50 mounted in the bracket 40.

The chassis 20 includes a shell 22 mounted to a front end of the chassis 20. The shell 22 includes a rectangular bottom wall 24, a top wall 25 opposite to the bottom wall 24, and a connecting wall 26 perpendicularly connected between rear sides of the bottom wall 24 and the top wall 25. The bottom wall 24, the top wall 25, and the connecting wall 26 cooperatively bound a receiving space 27 with an opening facing outside of the chassis 20 and separated from an inner space of the chassis 20 by the connecting wall 26. First ends of the bottom wall 24 and the top wall 25 define two opposite mounting holes 242, respectively. Two positioning poles 252 respectively protrude toward each other from second ends of the bottom wall 24 and the top wall 25 opposite to the mounting holes 242. An engaging piece 244 protrudes from the first end of the bottom wall 24 adjacent to the corresponding mounting hole 242 toward the top wall 25. A latching portion 251 is formed on a bottom of the top wall 25, adjacent to the corresponding mounting hole 242. The latching portion 251 includes a resilient latching bar 254 and a U-shaped handle 255 connected to the latching bar 254.

The bracket 40 includes a rectangular cage 42, a cover 44, a fastener 46 rotatably connected to the cage 42, and two shafts 48.

The cage 42 includes a front plate 422, a top plate 423 and a bottom plate 424 perpendicularly extending rearward from top and bottom sides of the front plate 422, a rear plate 425 perpendicularly connected between rear sides of the top plate 423 and the bottom plate 424, and a partition plate 426 perpendicularly connected between middles of the front plate 422 and the rear plate 425. The front plate 422, the top plate 423, the bottom plate 424, the rear plate 425, and the partition plate 426 cooperatively bound two receiving slots 427 respectively above and below the partition plate 426. Two rows of hooks 421 protrude out from the front plate 422, for latching cables of the electronic device 100. An end of the cage 42 defines a rectangular cutout 428 in the front plate 422. The ends of the top plate 423 and the bottom plate 424 adjacent to the cutout 428 define two opposite shaft holes 429. A tab 4232 protrudes up from the top plate 423, adjacent to the cutout 428.

The cover 44 includes a rectangular front plate 442, a side plate 443 perpendicularly extending rearward from a side of the front plate 442, and two end plates 445 perpendicularly extending rearward from top and bottom ends of the front plate 442. The front plate 442 defines a plurality of vents 446. The side plate 443 defines a through slot 447. A plurality of resilient engaging pieces 448 extends from an opposite side of the front plate 442 and the ends of the end plates 445, away from the side plate 443.

The fastener 46 is substantially U-shaped. The fastener 46 includes a rectangular operation plate 462 and two opposite rotating plates 464 slantingly extending from two ends of the operation plate 462 toward the same direction. Distal ends of the rotating plates 464 opposite to the operation plate 462 are rotatably connected to ends of the top plate 423 and the bottom plate 424 opposite to the cutout 428, adjacent to the front plate 422. The distal end of each rotating plate 464 also defines a notch 467.

The circuit board 50 is received in the cutout 428 and mounted to the rear plate 425. A plurality of components 52 is mounted on the circuit board 50. Two connectors 54 are mounted to a side of the circuit board 50 adjacent to the receiving slots 427, and align with the receiving slots 427. A cable 55 is electrically coupled to the circuit board 50.

Each power supply unit 60 includes a rectangular main body 61. A plug 62 is mounted to an end of the main body 61 and electrically coupled to the main body 61. An opposite end of the main body 61 defines an operation slot 64.

Figure 3:
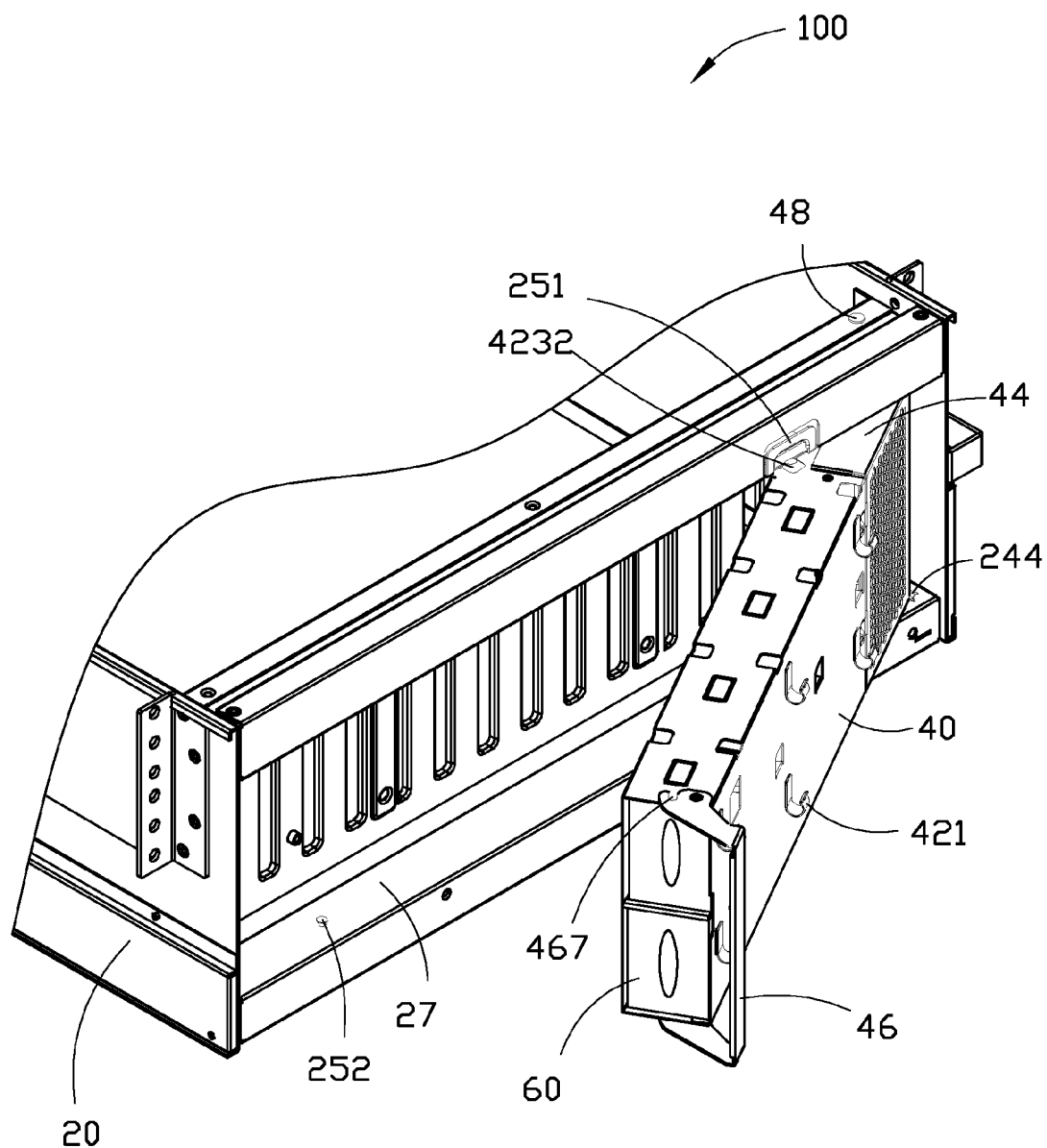
FIG. 3 is an assembled, isometric view of FIG. 1.

FIG. 3 shows that in assembly of the power supply positioning apparatus 10 to the chassis 20, a distal end of the cable 55 opposite to the circuit board 50 extends through the through slot 447 from a rear side of the cover 44 opposite to the front plate 442 and is electrically coupled to the chassis 20. The cover 44 is covering the cage 42, the cutout 428, with the engaging pieces 448 engaging with inner surfaces of the front plate 422, the top plate 423, and the bottom plate 424. Therefore, the cover 44 is mounted to the cage 42. The end of the bracket 40 defining the shaft holes 429 is inserted in the receiving space 27 of the chassis 20, with the rear plate 425 facing the connecting wall 26 and the shaft holes 429 aligning with the mounting holes 242. The shafts 48 extend through the mounting holes 242, to be received in the corresponding shaft holes 429. Thereby, the bracket 40 is rotatably installed to the shell 22 at an outer side of the connecting wall 26 about the shafts 48. The tab 4232 abuts against an outer surface of the latching bar 254, and the side plate 443 of the cover 44 engages with the engaging piece 244.

Figure 4:
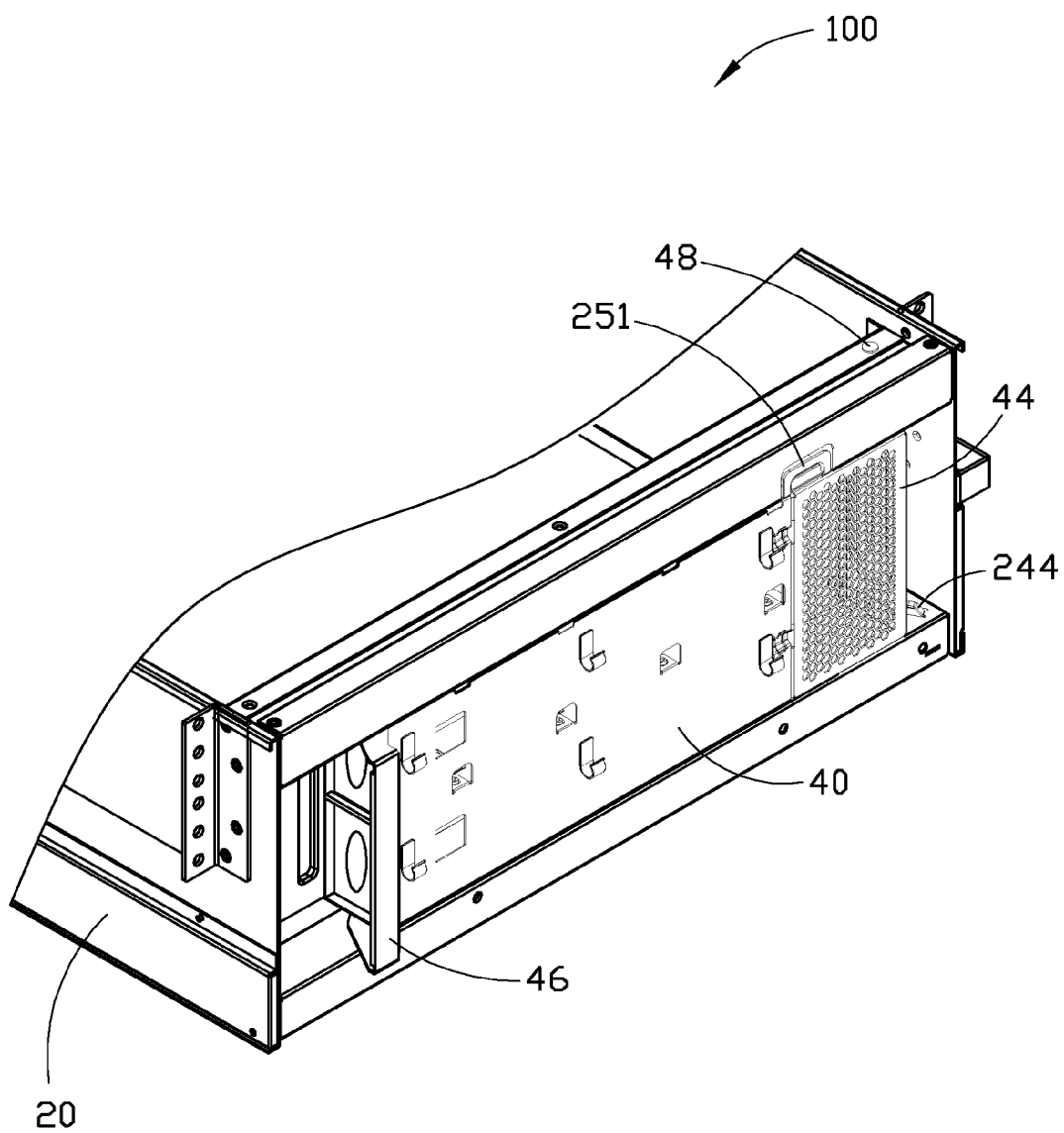
FIG. 4 is similar to FIG. 3, but shows the electronic device in use.

FIG. 4 shows that in use, the power supply units 60 are inserted into the receiving slots 427 of the cage 42, until the plugs 62 of the power supply units 60 are coupled to the corresponding connectors 54 of the circuit board 50. The handle 255 is pulled away from the receiving space 27, to deform the latching bar 254, until the tab 4232 is detached from the latching bar 254. The bracket 40 is rotated into the receiving space 27. The fastener 46 is rotated, to allow the positioning poles 252 to latch in the notches 467 of the fastener 46. Therefore, the bracket 40 together with the power supply units 60 is received in the receiving space 27 and faces the outside of the chassis 20.

To detach the power supply units 60 from the bracket 40, the operation plate 462 is operated to rotate the rotating plates 464, until the positioning poles 252 are detached from the notches 467. The operation plate 462 is pulled out. The bracket 40 is rotated away from the receiving space 27 about the shafts 48. The tab 4232 slidably abuts against the latching bar 254, to deform the latching bar 254, until the tab 4232 is detached from the latching bar 254. The side plate 443 of the cover 44 engages with the engaging piece 244 of the shell 22. The end opposite to the cover 44 of the bracket 40 is located out of the receiving space 27. The operation slots 64 facilitate the power supply units 60 to be easily pulled out of the cage 42.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A power supply positioning apparatus, comprising:
    a bracket defining a receiving slot for receiving a power supply unit; and
    a circuit board mounted in the bracket and comprising a connector mounted on the
    circuit board and aligning with the receiving slot;
    wherein a first end of the bracket is operable of being rotatably connected to a chassis of an electronic device and a second end of the bracket is operable of being detachably latched to the chassis, the bracket faces outside of the chassis;
    wherein the bracket further comprises a cage, a first end of the cage is rotatably connected to the chassis, the fastener is rotatably connected to a second end of the cage;
    wherein the cage comprises a front plate, a top plate and a bottom plate extending rearward from top and bottom sides of the front plate, and a rear plate connected between rear sides of the top plate and the bottom plate, wherein the front plate, the to plate, the bottom plate, and the rear plate cooperatively bound the receiving slot;
    wherein the first end of the cage defines a cutout, the circuit board is received in the cutout and mounted to the rear plate of the cage, the bracket further comprises a cover mounted to the cage to cover the cutout, the cover comprises a front plate defining a plurality of vents and a side plate defining a through slot, an end of a cable is electrically coupled to the circuit board, an opposite end of the cable extends out of the cage through the through slot.

2. The power supply positioning apparatus of claim 1, wherein the bracket comprises a fastener rotatably connected to the second end of the bracket, the fastener is operable of being detachably latched to the chassis.

3. The power supply positioning apparatus of claim 1, wherein a row of hooks protrude out from the front plate.

4. The power supply positioning apparatus of claim 1, wherein a tab protrudes up from the top plate to engage with the chassis.

5. The power supply positioning apparatus of claim 1, wherein the fastener comprises an operation plate and two opposite rotating plates extending from two ends of the operation plate toward the same direction, distal ends of the rotating plates opposite to the operation plate are rotatably connected to the top plate and the bottom plate, the distal end of each rotating plate defines a notch.

6. An electronic device, comprising:
    a chassis defining a receiving space with an opening facing outside of the chassis;
    a positioning apparatus mounted to the chassis in the receiving space, and comprising a bracket defining a receiving slot and a circuit board mounted in the bracket, the circuit board comprising a connector aligning with the receiving slot; and
    a power supply unit received in the receiving slot, and comprising a plug connected to the connector;
    wherein a first end of the bracket is rotatably connected to the chassis, and a second end of the bracket is detachably latched to the chassis;
    wherein the chassis comprises a shell mounted to an end of the chassis, the shell comprises a bottom wall, a top wall opposite to the bottom wall, and a connecting wall connected between corresponding sides of the bottom wall and the top wall, wherein the bottom wall, the top wall, and the connecting wall cooperatively bound the receiving space;
    wherein the bracket comprises a cage received in the receiving space, the power supply unit and the circuit board are received in the cage, a first end of the cage is rotatably connected to an end of the shell, and a second end of the cage is detachably latched to an opposite end of the shell;
    wherein the first end of the cage defines a cutout, the circuit board is received in the cutout, the bracket further comprises a cover mounted to the cage and covering the cutout, the cover comprises a front plate defining a plurality of vents and a side plate defining a through slot, the circuit board comprises a cable extending out of the cage through the through slot.

7. The electronic device of claim 6, wherein the cage comprises a front plate, a top plate and a bottom plate extending rearward from a top and bottom sides of the front plate, and a rear plate connected between rear sides of the top plate and the bottom plate, wherein the front plate, the top plate, the bottom plate, and the rear plate cooperatively bound the receiving slot, the power supply unit is received in the receiving slot.

8. The electronic device of claim 6, wherein a latching portion is formed on a bottom of the top wall of the shell, the latching portion comprises a resilient latching bar and a handle connected to the latching bar, a tab protrudes up from the top plate of the cage to engage with the latching bar.

9. The electronic device of claim 6, wherein the bracket further comprises a fastener, the fastener comprises an operation plate and two opposite rotating plates extending from two ends of the operation plate toward the same direction, distal ends of the rotating plates opposite to the operation plate are rotatably connected to ends of the top plate and the bottom plate of the cage, the distal end of each rotating plate defines a notch, two positioning poles protrude toward each other from the bottom wall and the top wall of the shell, the positioning poles are latched in the notches of the fastener.

10. The electronic device of claim 6, wherein an engaging piece protrudes from the bottom wall to engage with the first end of the cage.

\* \* \* \* \*